(12) United States Patent
Kanamori et al.

(10) Patent No.: US 10,574,043 B2
(45) Date of Patent: Feb. 25, 2020

(54) ELECTRICAL CONNECTION BOX

(71) Applicant: Yazaki Corporation, Tokyo (JP)

(72) Inventors: Takanori Kanamori, Shizuoka (JP); Tatsuya Fukunaga, Shizuoka (JP); Takuomi Wada, Shizuoka (JP); Kenji Segawa, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/108,055

(22) Filed: Aug. 21, 2018

(65) Prior Publication Data
US 2019/0067923 A1 Feb. 28, 2019

(30) Foreign Application Priority Data

Aug. 23, 2017 (JP) ................. 2017-160532

(51) Int. Cl.
| | | |
|---|---|---|
| H01R 13/68 | (2011.01) | |
| H02G 3/08 | (2006.01) | |
| H02G 3/14 | (2006.01) | |
| B60R 16/02 | (2006.01) | |
| H01R 13/502 | (2006.01) | |
| H05K 5/03 | (2006.01) | |
| H01R 13/506 | (2006.01) | |
| H01R 9/22 | (2006.01) | |
| H02G 3/16 | (2006.01) | |
| B60R 16/023 | (2006.01) | |

(52) U.S. Cl.
CPC ............ *H02G 3/081* (2013.01); *B60R 16/02* (2013.01); *H01R 13/502* (2013.01); *H02G 3/14* (2013.01); *H05K 5/03* (2013.01); *B60R 16/0238* (2013.01); *H01R 9/223* (2013.01); *H01R 13/506* (2013.01); *H01R 2201/26* (2013.01); *H02G 3/16* (2013.01)

(58) Field of Classification Search
CPC ................ H01R 13/6658; H01R 13/68; H01R 2201/26; H01R 31/00; H01R 9/2458
USPC ..... 439/620.01, 620.34, 682, 949, 76.2, 723
See application file for complete search history.

(56) References Cited

U.S. PATENT DOCUMENTS 7,431,605 B2 * 10/2008 Dieterle ............. H01R 13/6272
439/358

FOREIGN PATENT DOCUMENTS

JP 2006-275084 A 10/2006

* cited by examiner

*Primary Examiner* — Phuong Chi Thi Nguyen
(74) *Attorney, Agent, or Firm* — Kenealy Vaidya LLP

(57) ABSTRACT

An electrical connection box includes: a lower cover having an opening; a locked portion formed on a lower side wall of the lower cover; an upper cover closing the opening of the lower cover; a locking portion that is formed on an upper side wall of the upper cover and is locked by the locked portion to restrict the upper cover from moving in a detachment direction with respect to the lower cover; a contact rib that is formed on the upper side wall, protrudes toward the lower side wall, and has a distal end formed to be close to a side of an assembly direction in which the upper cover is assembled with respect to the lower cover compared to the locked portion; and a locking portion slit formed between the locking portion and the contact rib on the upper side wall.

8 Claims, 6 Drawing Sheets

ELECTRICAL CONNECTION BOX

CROSS-REFERENCE TO RELATED APPLICATION(S)

The present application claims priority to and incorporates by reference the entire contents of Japanese Patent Application No. 2017-160532 filed in Japan on Aug. 23, 2017.

BACKGROUND OF THE INVENTION

1. Field of the Invention

The present invention relates to an electrical connection box.

2. Description of the Related Art

Conventionally, an electrical connection box (also referred to as a junction box, a fuse box, a relay box, or the like), which is mounted on a vehicle such as an automobile and collectively accommodates connection processing components such as a wire harness and electronic components such as a fuse, a relay, and an electronic control unit, has been known.

In the conventional electrical connection box, a locking portion formed on an upper side wall of an upper cover is locked with a locked portion formed on a lower side wall by moving the upper cover in an assembly direction with respect to a lower cover, and the upper cover is assembled with the lower cover by restricting the upper cover from moving in a detachment direction, which is a direction opposite to the assembly direction, with respect to the lower cover. Further, in the conventional electrical connection box, a rib is formed on the lower side wall, a slit is formed in the upper side wall, and the rib is inserted into the slit at the time of assembling the lower cover and the upper cover, thereby performing positioning of the upper cover with respect to the lower cover (Japanese Patent Application Laid-open No. 2006-275084).

Meanwhile, positioning in a plane orthogonal to the assembly direction is important for the positioning of the upper cover with respect to the lower cover. In the case of inserting the rib into the slit as in the conventional electrical connection box, a slit width is formed to be larger than a rib width so that a gap is formed between the rib and the slit in a state where the rib is inserted into the slit. Therefore, there is a risk that rattle and abnormal noise may occur in a state where the upper cover is assembled with the lower cover.

SUMMARY OF THE INVENTION

The present invention has been made in view of the above-described problem, and an object thereof is to provide an electrical connection box capable of reliably perform positioning of an upper cover with respect to a lower cover.

An electrical connection box according to one aspect of the present invention includes a lower cover having an opening; a locked portion formed on a lower side wall of the lower cover; an upper cover closing the opening of the lower cover; a locking portion that is formed on an upper side wall of the upper cover and is locked by the locked portion to restrict the upper cover from moving in a detachment direction with respect to the lower cover; a contact rib that is formed on the upper side wall, protrudes toward the lower side wall, and has a distal end formed to be close to a side of an assembly direction in which the upper cover is assembled with respect to the lower cover compared to the locked portion; and a locking portion slit formed between the locking portion and the contact rib on the upper side wall.

According to another aspect of the present invention, it is preferable that the electrical connection box further includes a contact rib slit formed on an opposite side of the locking portion slit with the contact rib interposed therebetween.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Incidentally, the invention is not limited by the embodiment. In addition, constituent elements in the following embodiment include one that can be replaced by a person skilled in the art or substantially the same one.

Embodiment

Figure 1:
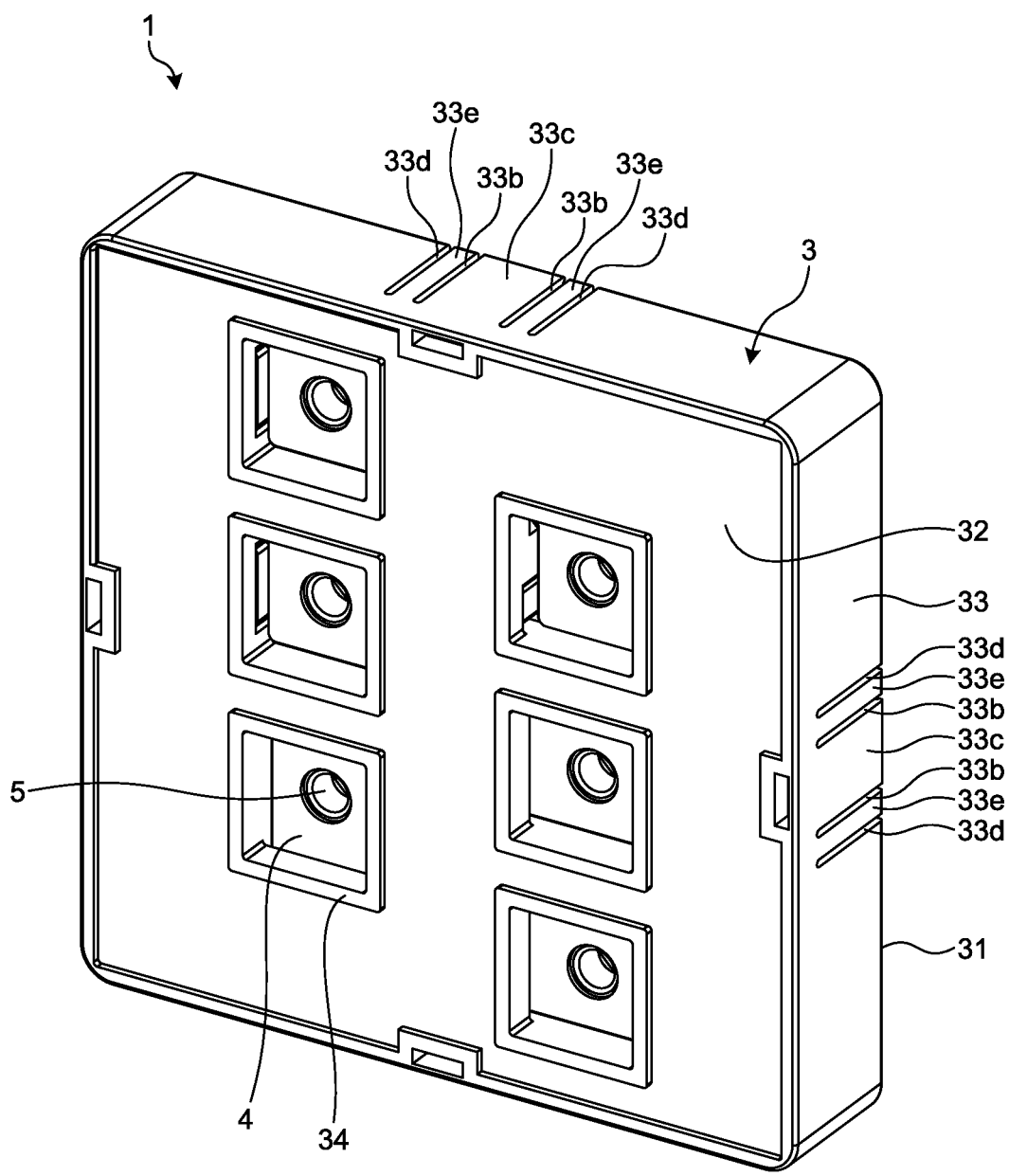
FIG. 1 is a perspective view of an electrical connection box according to an embodiment.
Figure 1:
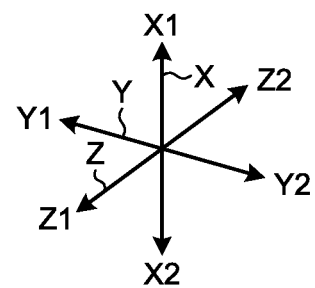
Figure 2:
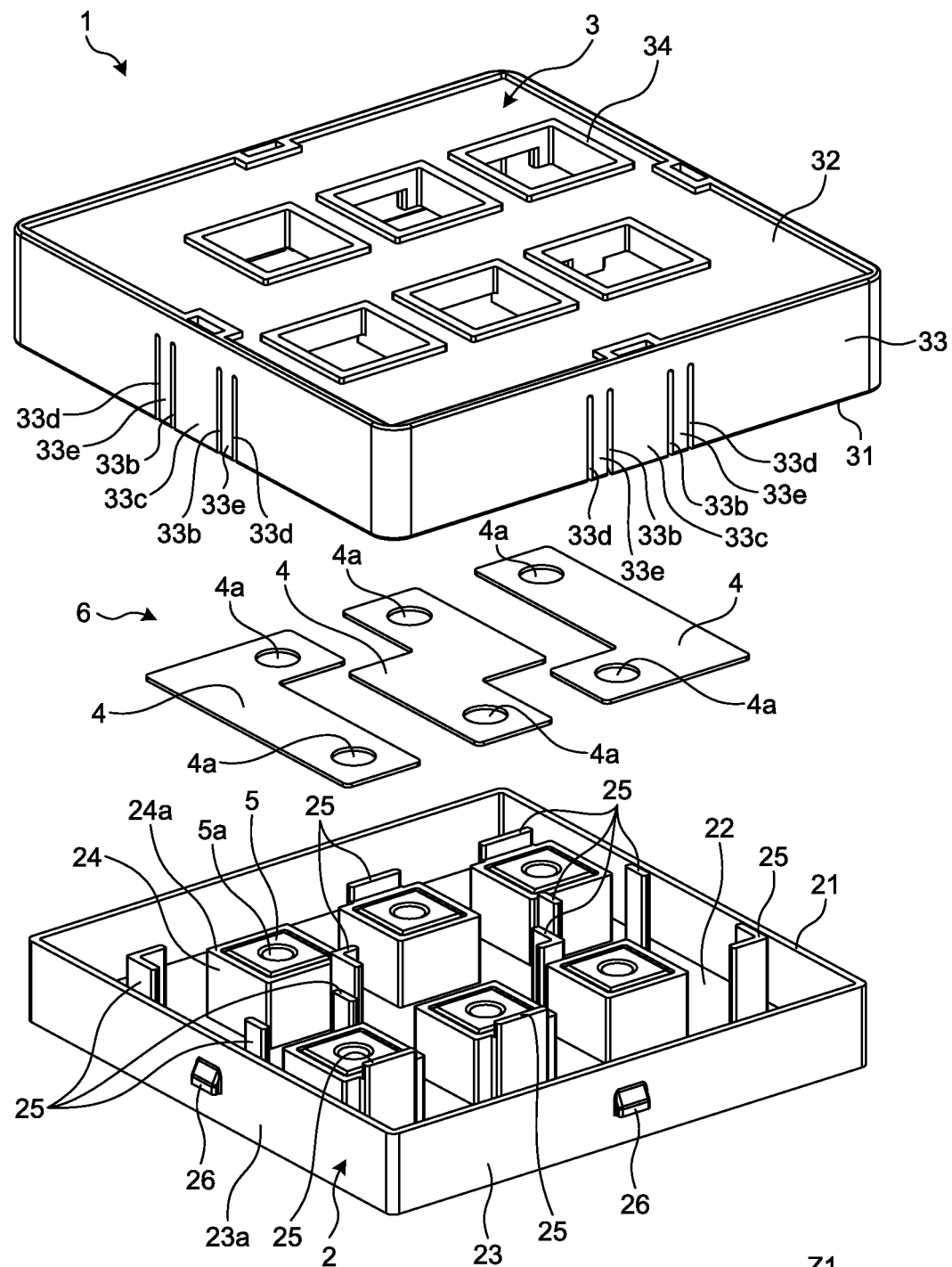
FIG. 2 is an exploded perspective view of the electrical connection box according to the embodiment.
Figure 2:
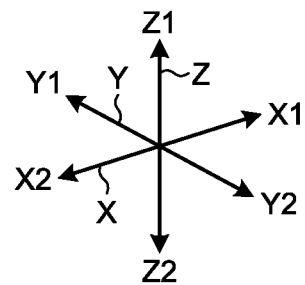
Figure 3:
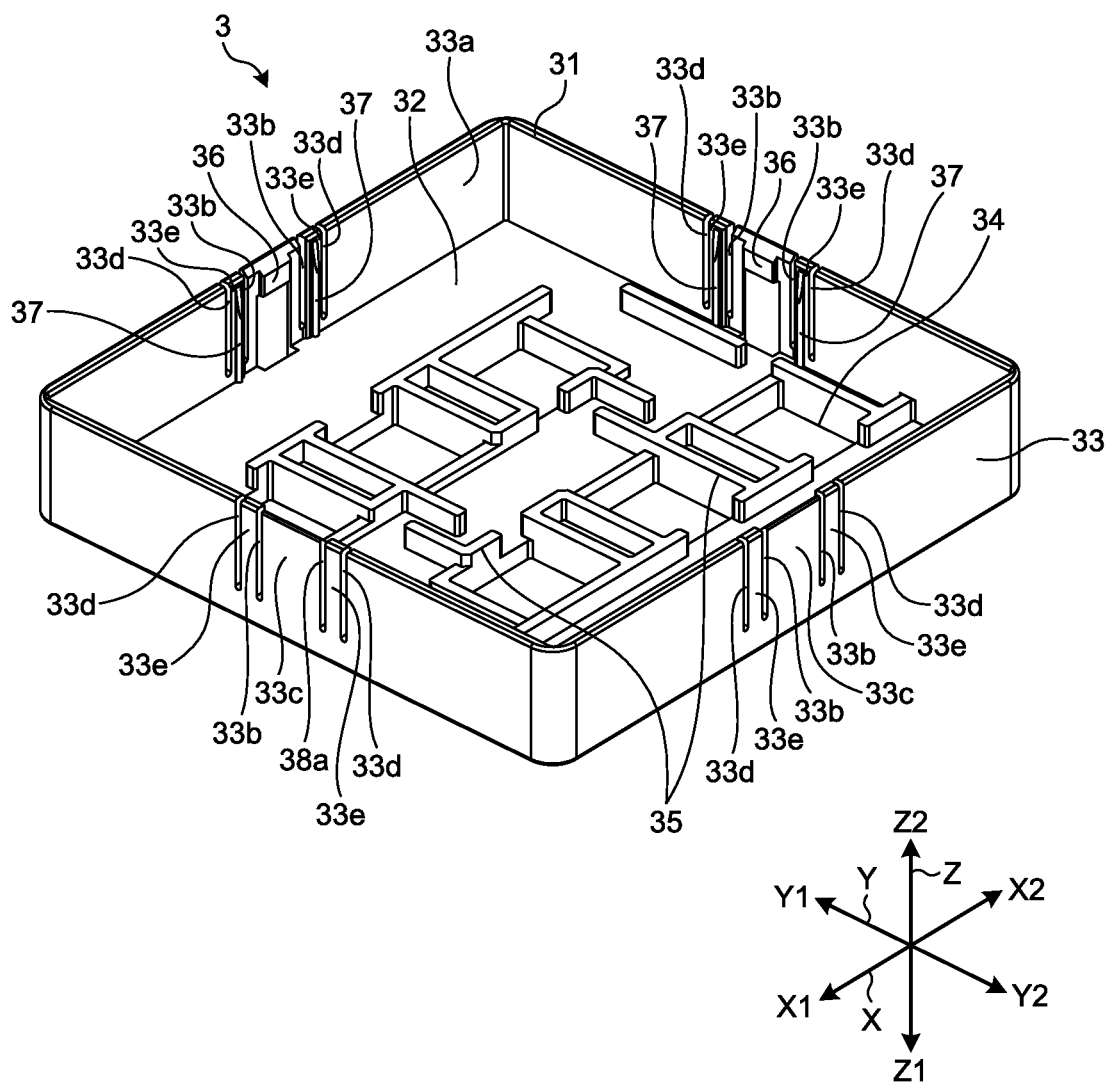
FIG. 3 is a perspective view of an upper cover according to the embodiment.
Figure 4:
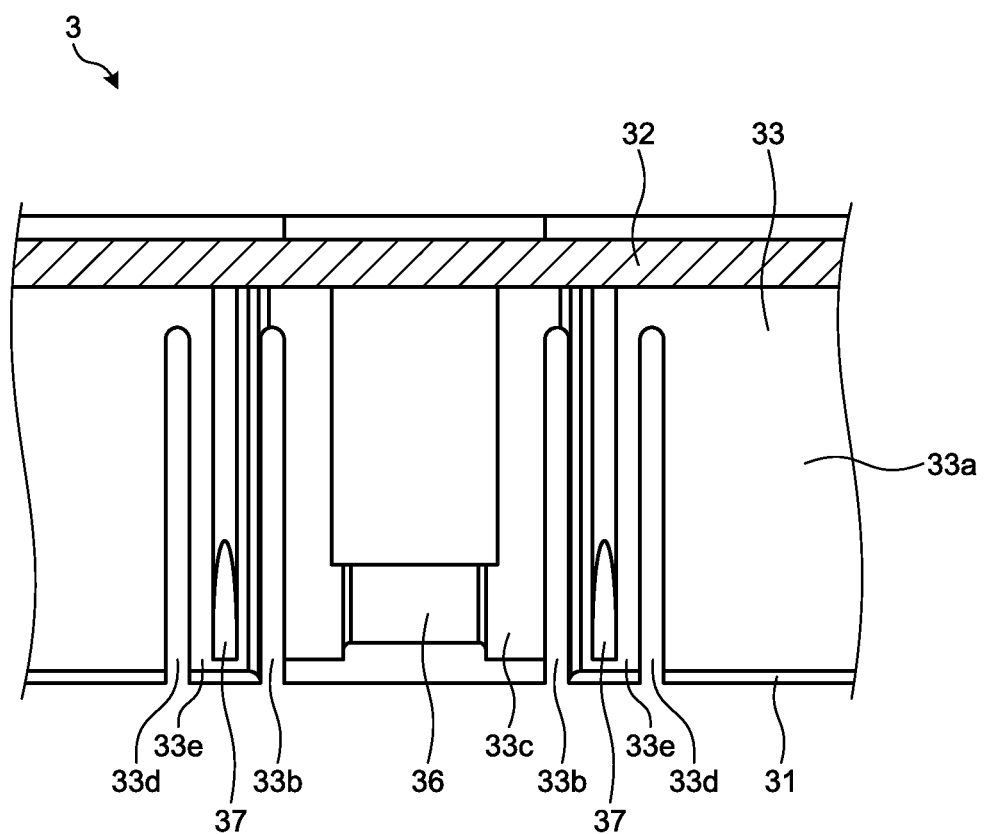
FIG. 4 is a partial plan view of the upper cover according to the embodiment.
Figure 4:
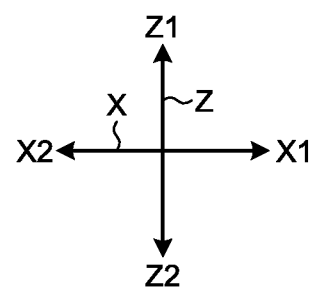
Figure 5:
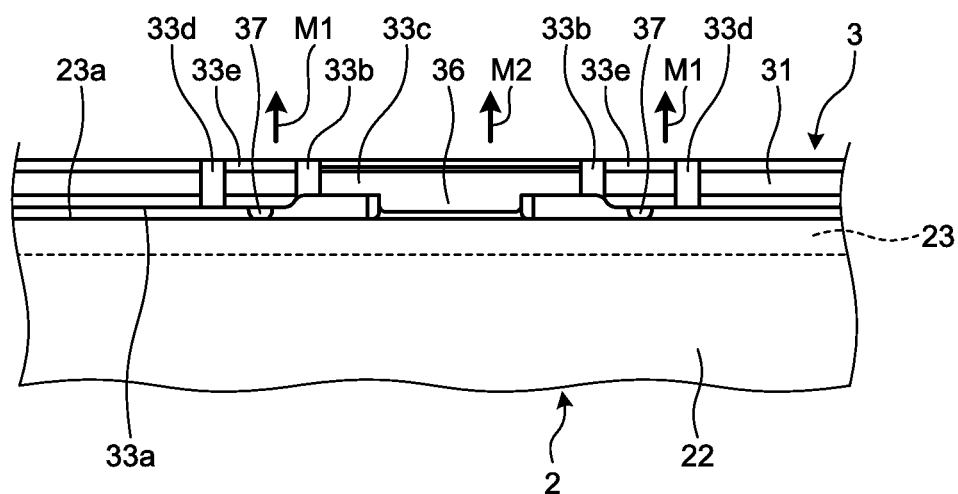
FIG. 5 is a partial bottom view of the electrical connection box according to the embodiment.
Figure 5:
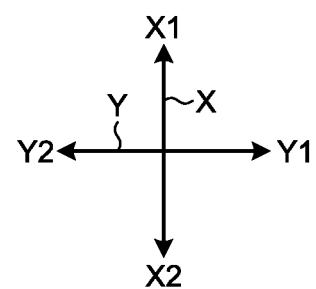
Figure 6:
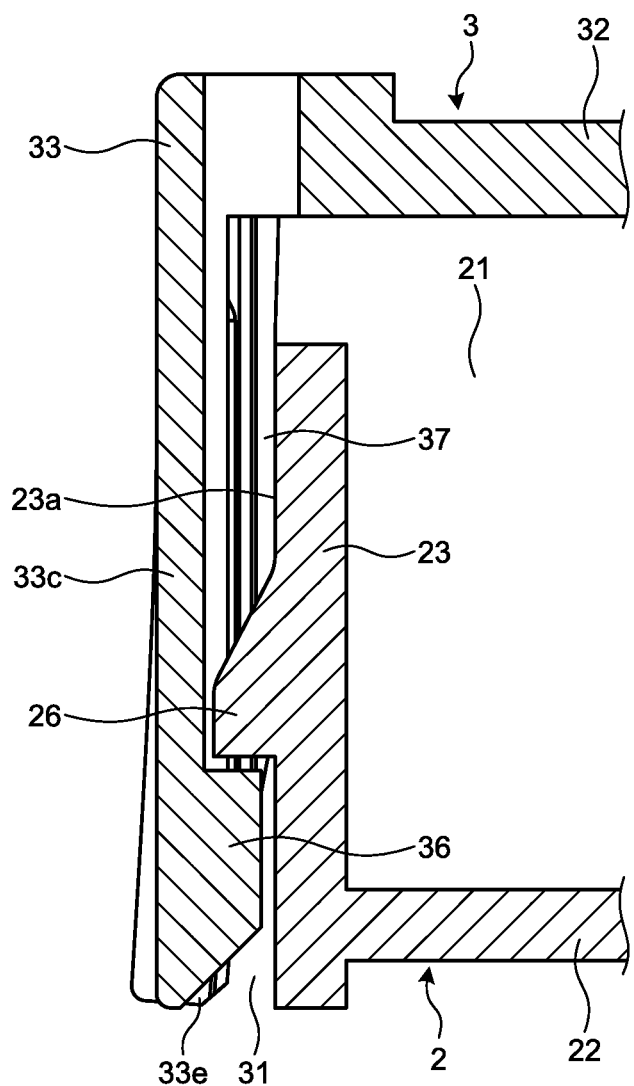
FIG. 6 is a partial cross-sectional view of the electrical connection box according to the embodiment.
Figure 6:
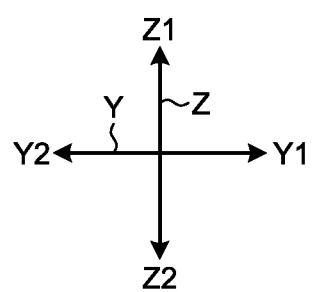

An electrical connection box according to an embodiment will be described. FIG. 1 is a perspective view of the electrical connection box according to the embodiment. FIG. 2 is an exploded perspective view of the electrical connection box according to the embodiment. FIG. 3 is a perspective view of an upper cover according to the embodiment. FIG. 4 is a partial plan view of the upper cover according to the embodiment. FIG. 5 is a partial bottom view of the electrical connection box according to the embodiment. FIG. 6 is a partial cross-sectional view of the electrical connection box according to the embodiment.

An electrical connection box 1 according to the present embodiment is mounted on a vehicle such as an automobile and distributes electric power supplied from a power supply such as a battery to various electronic devices mounted on the vehicle via various electronic components or the like. The electrical connection box 1 is installed at a place that is exposed to external environment, for example, an engine room of the vehicle or the like, and is connected between the power supply and the various electronic devices. The electrical connection box 1 may constitute a wire harness together with an electric wire. The electrical connection box 1 is sometimes referred to as a junction box, a fuse box, a relay box, or the like depending on a type of an electronic component to be accommodated, and these terms will be collectively referred to as the "electrical connection box" in the present embodiment.

In the following description, an X direction in the drawing is a vertical direction of the electrical connection box 1 in the present embodiment. Among the X directions, an X1 direction is an upward direction and an X2 direction is a downward direction. A Y direction in the drawing is a width direction of the electrical connection box 1 in the present embodiment, and is a direction orthogonal to the vertical direction. Among the Y directions, a Y1 direction is one direction and a Y2 direction is the other direction. A Z direction in the drawing is a thickness direction of the electrical connection box 1 in the present embodiment, and is a direction orthogonal to the vertical direction and the width direction. Among the Z directions, a Z1 direction is a detachment direction and a Z2 direction is an assembly direction.

The electrical connection box 1 of the present embodiment has a rectangular parallelepiped shape. As illustrated in FIG. 1 and the like, the electrical connection box 1 is configured to include a lower cover 2, an upper cover 3, a bus bar 4, a nut 5, a locked portion 26, a locking portion 36, a contact rib 37, a locking portion slit 33b, and a contact rib slit 33d. As illustrated in FIG. 2, the lower cover 2 and the upper cover 3 are engaged with each other to form an internal space 6 to accommodate the bus bar 4 and the nut 5.

The lower cover 2 is engaged with the upper cover 3 and forms the internal space 6 together with the upper cover 3. The lower cover 2 is formed using an insulating material such as a synthetic resin. The lower cover 2 of the present embodiment has a box shape and has an opening 21 at an end on a side of the detachment direction between both ends in the thickness direction. As illustrated in FIGS. 2 and 4, the lower cover 2 has a bottom 22, a lower side wall 23, a nut holding portion 24, a first rib 25, and a locked portion 26.

The bottom 22 has a flat plate shape. The bottom 22 is formed with the lower side wall 23 that is erected from an outer circumference toward the detachment direction. The bottom 22 is formed with the nut holding portion 24 and the first rib 25 erected toward the detachment direction.

The lower side wall 23 is formed in a tubular shape when viewed from the thickness direction. An end of the lower side wall 23 on a side of the assembly direction between both ends in the thickness direction is connected to the bottom 22, and the opening 21 is formed by an end on a side of the detachment direction. The locked portions 26 locked by locking portions 36 are formed, respectively, at portions of the lower side wall 23 corresponding to four sides constituting an outer circumference of the lower cover 2.

The nut holding portion 24 holds the nut 5. The nut holding portion 24 is erected from the bottom 22 toward the detachment direction. Here, the nut holding portion 24 is formed on the assembly direction side of the first rib 25 in the thickness direction, that is, formed to be lower than the first rib 25 as viewed from the bottom 22. The nut holding portion 24 is formed in a cylindrical shape and has an opening 24a so that the nut 5 can be inserted therethrough. The opening 24a of the nut holding portion 24 is in contact with a surface of the bus bar 4 on the assembly direction side. The nut holding portion 24 of the present embodiment is provided such that two nut holding portions form one pair, and it is possible to place the single bus bar 4 with respect to the two nut holding portions 24.

The first rib 25 restricts a position of the bus bar 4 with respect to the lower cover 2 in an assembly state of the lower cover 2 and the upper cover 3, that is, an assembled state. The first rib 25 is composed of at least four first ribs 25 formed of two pairs opposing each other with the bus bar 4 interposed therebetween. One pair corresponds to the first ribs 25 and 25 opposing each other in the vertical direction, and the other pair corresponds to the first ribs 25 and 25 opposing each other in the width direction. When viewed from the vertical direction, a region surrounded by the respective first ribs 25, that is, the region surrounded by the respective first ribs 25 by extending one pair of the first ribs 25 and 25 in the width direction and extending the other pair of the first ribs 25 and 25 in the vertical direction is formed to be wider than the corresponding bus bar 4. Further, an interval in the vertical direction between one pair of the first ribs 25 and 25 is formed to be larger than a length in the vertical direction of the nut holding portion 24. Further, an interval in the width direction of the other pair of the first ribs 25 and 25 is formed to be larger than a length in the width direction of the nut holding portion 24. Here, each of the first ribs 25 may be present alone at the bottom 22, or two or more first ribs 25 may be connected. When the two or more first ribs 25 are connected, the substantial number of the first ribs 25 in the lower cover 2 can be reduced, and the strength of the first ribs 25 can be improved.

The locked portion 26 is formed on the lower side wall 23 and is locked by the locking portion 36 in the assembled state. The locked portion 26 is formed on an outer circumferential surface 23a of the lower side wall 23 and is formed so as to protrude toward an upper side wall 33, which will be described later, of the opposing upper cover 3 in the assembled state. Each of the locked portions 26 corresponds to each of the locking portions 36.

The upper cover 3 is engaged with the lower cover 2 and closes the opening 21 of the lower cover 2 to form the internal space 6. The upper cover 3 is formed using an insulating material such as a synthetic resin. The upper cover 3 of the present embodiment has a box shape and has an opening 31 at an end on the assembly direction side between both ends in the thickness direction. The upper cover 3 has a ceiling 32, the upper side wall 33, a connector front opening 34, a second rib 35, the locking portion 36, and a contact rib 37.

The ceiling 32 has a flat plate shape. The ceiling 32 is formed with the upper side wall 33 erected from an outer circumference toward the assembly direction. The connector front opening 34 is formed on the ceiling 32. The second rib 35 erected toward the assembly direction is formed on the ceiling 32.

The upper side wall 33 is formed in a tubular shape when viewed from the thickness direction. An end of the upper side wall 33 on the detachment direction side is connected to the ceiling 32 between both ends in the thickness direction, and the opening 31 is formed by an end in the assembly direction side. Here, the opening 31 is formed to be wider than an outer circumference of the lower cover 2 when viewed from the thickness direction. The locking portions 36 by which the locked portions 26 are locked are formed, respectively, at portions of the upper side wall 33 corresponding to four sides constituting an outer circumference of the upper cover 3. The upper side wall 33 has a pair of the locking portion slits 33b and 33b formed on each side where each of the locking portions 36 is formed. An end on the assembly direction side of the locking portion slit 33b is formed up to an end on the assembly direction side of the upper side wall 33 and communicates with the outside. An end on the detachment direction side of the locking portion slit 33b of the present embodiment is formed up to an end on the detachment direction side of the upper side wall 33, that is, a portion connected to the ceiling 32. The pair of locking portion slits 33b and 33b is formed with the locking portion 36 interposed therebetween in the extending direction of the upper side wall 33, that is, in the vertical direction or the width direction. That is, the locking portion slit 33b is formed between the locking portion 36 and the contact rib 37 to be described later. The upper side wall 33 has a pair of the contact rib slits 33d and 33d formed on each side where each of the locking portions 36 is formed. Each of the contact rib slits 33d is formed to correspond to each of the locking portion slits 33b. An end on the assembly direction side of the contact rib slit 33d is formed up to the end on the assembly direction side of the upper side wall 33 and communicates with the outside. An end on the detachment direction side of the contact rib slit 33d of the present embodiment is formed up to the end on the detachment direction side of the upper side wall 33, that is, the portion connected to the ceiling 32. The pair of contact rib slits 33d and 33d is formed on a side opposite to the locking portion slits 33b with the contact rib 37 interposed therebetween in the extending direction of the upper side wall 33, that is, in the vertical direction or the width direction.

The connector front opening 34 connects the bus bar 4 and an external connector terminal (not illustrated), and is arranged such that the bus bar 4 accommodated in the internal space 6 is exposed to the outside. The connector front opening 34 is formed to penetrate through the ceiling 32 in the thickness direction. In the assembled state, the connector front opening 34 is formed so as to oppose a through hole 4a, which will be described later, of the bus bar 4 and a screw hole 5a, which will be described later, of the nut 5 in the thickness direction. The connector front opening 34 in the present embodiment is formed such that two connector front openings form one pair to correspond to the single bus bar 4.

The second rib 35 restricts a position of the bus bar 4 with respect to the upper cover 3 in an assembly state of the lower cover 2 and the upper cover 3, that is, an assembled state. The second rib 35 is composed of at least four second ribs 35 formed of two pairs opposing each other with the bus bar 4 interposed therebetween. One pair corresponds to the second ribs 35 and 35 opposing each other in the vertical direction, and the other pair corresponds to the second ribs 35 and 35 opposing each other in the width direction. When viewed from the vertical direction, a region surrounded by the respective second ribs 35, that is, the region surrounded by the respective second ribs 35 by extending one pair of the second ribs 35 and 35 in the width direction and extending the other pair of the second ribs 35 and 35 in the vertical direction is formed to be wider than the corresponding bus bar 4. Further, an interval in the vertical direction between one pair of the second ribs 35 and 35 is formed to be larger than a length in the vertical direction of the nut holding portion 24. Further, an interval in the width direction of the other pair of the second ribs 35 and 35 is formed to be larger than a length in the width direction of the nut holding portion 24. Here, each of the second ribs 35 may be present alone at the ceiling 32, or two or more second ribs 35 may be connected. When the two or more second ribs 35 are connected, the substantial number of the second ribs 35 in the upper cover 3 can be reduced, and the strength of the second ribs 35 can be improved.

Here, the first rib 25 and the second rib 35 are provided at different positions as the first rib 25 and the second rib 35 are viewed from the direction of assembling the lower cover 2 and the upper cover 3, that is, the thickness direction. In the present embodiment, the first ribs 25 and the second ribs 35 are formed so as not to overlap with each other when viewed from the thickness direction.

The locking portion 36 is formed on the upper side wall 33 and locks the locked portion 26 in the assembled state. The locking portion 36 is formed on an inner circumferential surface 33a of the upper side wall 33, and is formed so as to protrude toward the opposing lower side wall 23 in the assembled state. Each of the locking portions 36 corresponds to each of the locked portions 26. Each of the locking portions 36 is formed in each of locking portion wall pieces 33c formed between the pair of locking portion slits 33b and 33b of the upper side wall 33. Here, a protruding amount of the locking portion 36 from the inner circumferential surface 33a is formed such that at least a part thereof overlaps with the locked portion 26 in the assembled state when viewed from the thickness direction. In addition, the protruding amount of the locking portion 36 from the inner circumferential surface 33a, that is, a separation distance between the pair of locking portions 36 and 36 opposing each other in the vertical direction or the width direction is formed to be wider than a separation distance of the outer circumferential surface 23a between a pair of two sides of the lower side wall 23 opposing each other in the vertical direction or the width direction.

The contact rib 37 is formed on the upper side wall 33 and is in contact with the lower side wall 23 in the assembled state. The contact rib 37 is formed on the inner circumferential surface 33a of the upper side wall 33, and is formed so as to protrude toward the opposing lower side wall 23 in the assembled state. The contact rib 37 of the present embodiment has an end on the assembly direction side formed up to the vicinity of the end on the assembly direction side of the upper side wall 33, and an end on the detachment direction side formed to be connected to the ceiling 32. Here, the contact rib 37 is formed such that the end on the assembly direction side, that is, a distal end is closer to the assembly direction side than the end on the assembly direction side of the locking portion 36. A protruding amount of the contact rib 37 from the inner circumferential surface 33a, that is, a separation distance between the pair of contact ribs 37 opposing each other in the vertical direction or the width direction is formed to be narrower than the separation distance of the outer circumferential surface 23a between the pair of two sides of the lower side wall 23 opposing each other in the vertical direction or the width direction. Further, the protruding amount of the contact rib 37 from the inner circumferential surface 33a is formed to protrude more than the protruding amount of the locking portion 36 formed on the same side of the upper side wall 33. Each of the contact ribs 37 is formed in each of contact rib wall pieces 33e formed between the locking portion slit 33b and the contact rib slit 33d of the upper side wall 33. Here, the pair of contact rib wall pieces 33e is formed with the locking portion wall piece 33c interposed therebetween. The contact rib 37 of the present embodiment is formed to have a small protruding amount.

The bus bar 4 is accommodated in the internal space 6 in the assembled state, and is electrically connected to the external connector terminal. The bus bar 4 is formed using a conductive plate-shaped member such as copper. The bus bar 4 is formed, for example, by shearing and bending a metal plate, which is a base material, by a press machine or the like. As illustrated in FIG. 2, the bus bar 4 of the present embodiment is formed in an L shape or an S shape when viewed from the thickness direction. In the assembled state, the bus bar 4 is sandwiched between the one pair of first ribs 25 and 25, sandwiched between the other pair of first ribs 25 and 25, sandwiched between the one pair of second ribs 35 and 35, and sandwiched between the other pair of second ribs 35 and 35. The bus bar 4 has the through hole 4a into which a screw member having been inserted into a through hole (not illustrated) of a connector terminal (not illustrated) can be inserted. A pair of the through holes 4a is formed at both ends in the width direction of the bus bar 4 of the present embodiment. That is, the bus bar 4 is arranged so as to be exposed from the connector front opening 34 at both the ends in the width direction, and is electrically connected to the external connector terminal.

The nut 5 is accommodated in the internal space 6 in the assembled state, and fastens the screw member which has been inserted into the through hole (not illustrated) of the external connector terminal and the through hole 4a of the bus bar 4. The nut 5 is formed into a rectangular parallelepiped shape and has the screw hole 5a to which the screw member is fastened. The nut 5 in the present embodiment is formed such that two nuts form one pair to correspond to the single bus bar 4.

Next, the assembly of the electrical connection box 1 will be described. First, the nut 5 is held by each of the nut holding portions 24 of the lower cover 2. Next, the bus bar 4 is accommodated with respect to the lower cover 2. Specifically, the respective bus bars 4 are assembled with the lower cover 2 by being placed on the corresponding pair of nut holding portions 24. At this time, each of the bus bars 4 is sandwiched between one pair of the first ribs 25 and 25 and sandwiched between the other pair of the first ribs 25 and 25. Therefore, positioning of each of the bus bars 4 is performed with respect to the lower cover 2.

Next, the upper cover 3 is assembled with the lower cover 2. Specifically, the upper cover 3 is arranged with respect to the lower cover 2 such that the opening 31 opposes the opening 21 of the lower cover 2 in the thickness direction, and the upper cover 3 is moved in the assembly direction with respect to the lower cover 2. At this time, since the end on the assembling direction of the contact rib 37 is formed on the assembly direction side of the locking portion 36, the pair of contact ribs 37 and 37 formed on each side of the upper side wall 33 is first brought into contact with the outer circumferential surface 23a of the lower side wall 23. When the upper cover 3 is further moved in the assembly direction with respect to the lower cover 2, the contact rib wall pieces 33e where the contact ribs 37 and 37 are formed, respectively, are deformed with the end on the detachment direction side as a base point toward the outer side of the lower side wall 23 (M1 illustrated in FIG. 5). That is, the upper cover 3 is pressed toward a center of the lower cover 2 in a plane formed by the vertical direction and the width direction, that is, the horizontal plane by each of the contact rib wall pieces 33e. At this time, since the locking portion wall piece 33c is independent of the contact rib wall piece 33e, the locking portion 36 is not deformed toward the outer side of the lower side wall 23. When the upper cover 3 is further moved in the assembly direction with respect to the lower cover 2, the locking portions 36 formed on each side of the upper side wall 33 is brought into contact with the outer circumferential surface 23a of the lower side wall 23. When the upper cover 3 is further moved in the assembly direction with respect to the lower cover 2, the locking portion 36 is brought into contact with the locked portion 26. When the upper cover 3 is further moved in the assembly direction with respect to the lower cover 2, the locking portion wall piece 33c where the locking portion 36 is formed is deformed with the end on the detachment direction side as a base point toward the outer side of the lower side wall 23 (M2 illustrated in FIG. 5). When the upper cover 3 is further moved in the assembly direction with respect to the lower cover 2, the locking portion 36 gets over the locked portion 26 in the assembly direction, and the locking portion 36 is positioned on the assembly direction side with respect to the locked portion 26. As a result, the lower cover 2 is covered with the upper cover 3, and the opening 21 is closed by the upper cover 3. At this time, each of the bus bars 4 positioned with respect to the lower cover 2 by the first ribs 25 is sandwiched between the one pair of second ribs 35 and 35 and sandwiched between the other pair of second ribs 35 and 35. Therefore, the positioning of each of the bus bars 4 is performed with respect to the upper cover 3. Even in the state where the upper cover 3 is assembled with the lower cover 2, the upper cover 3 is in the state of being pressed by the respective contact rib wall pieces 33e toward the center of the lower cover 2 in the plane formed by the vertical direction and the width direction.

Next, the screw member is inserted into the connector front opening 34 in the state of being inserted into the through hole of the external connector terminal. Next, the screw member that has been inserted into the connector front opening 34 is inserted into the through hole 4a of the bus bar 4. Next, the screw member is fastened to the nut 5 by screwing the screw member that has been inserted into the through hole 4a into the screw hole 5a of the nut 5. As a result, the external connector terminal and the bus bar 4 are electrically connected, power is supplied from the outside of the electrical connection box 1 to the bus bar 4, and power is supplied to another electronic device via the external connector terminal electrically connected to the same bus bar 4.

As described above, the electrical connection box 1 of the present embodiment maintains the state where the upper cover is pressed toward the center of the lower cover 2 in the horizontal plane by the respective contact rib wall pieces 33e in the assembled state, and thus, the relative movement of the upper cover 3 in the horizontal plane with respect to the lower cover 2 is restricted. Therefore, it is possible to reliably performing the positioning of the upper cover 3 with respect to the lower cover 2, and to reliably suppress the occurrence of rattle and abnormal noise in the assembled state.

In addition, since the locking portion slit 33b is formed between the contact rib 37 and the locking portion 36, the locking portion wall piece 33c where the locking portion 36 is formed is not deformed even if the contact rib wall piece 33e where the contact rib 37 is formed is deformed. Therefore, even if a position of the contact rib 37 in the assembled state changes from a position of the contact rib 37 before the assembly, relative positions of the locking portion 36 and the locked portion 26 in the assembled state do not change. Therefore, it is possible to reliably maintain a locking state of the locked portion 26 by the locking portion 36 in a state where the positioning of the upper cover 3 with respect to the lower cover 2 is reliably performed. As a result, it is possible to reliably restrict the upper cover 3 from moving in the detachment direction from the lower cover 2 in the assembled state using the locking portion 36 and the locked portion 26.

In addition, the contact rib wall piece 33e can be easily deformed since the contact rib slit 33d is formed on the opposite side of the locking portion slit 33b with the contact rib 37 interposed therebetween. Therefore, a pressing force at the time of moving the upper cover 3 in the assembly direction with respect to the lower cover 2 in a state where the contact rib 37 is in contact with the lower side wall 23 can be made smaller than that in a case where the contact rib slit 33d is not formed. As a result, it is possible to easily assemble the upper cover 3 with the lower cover 2.

The contact rib 37 is formed on the upper cover 3 in the electrical connection box 1 of the above-described embodiment, but the invention is not limited thereto, and the contact rib may be formed on the lower cover 2. In this case, locked portion slits are formed with the locked portion 26 interposed therebetween. Further, a contact rib slit is formed on the opposite side of the locked portion slit with the contact rib interposed therebetween.

In addition, each of the bus bars 4 is assembled with the lower cover 2 in the electrical connection box 1 of the above-described embodiment, but the invention is not limited thereto, and each of the bus bars 4 may be assembled with the upper cover 3 first and then, the upper cover 3 may be assembled with the lower cover 2.

An electrical connection box according to the present embodiments achieves an effect that it is possible to reliably perform the positioning of the upper cover with respect to the lower cover.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
    a lower cover having an opening;
    a locked portion formed on a lower side wall of the lower cover;
    an upper cover closing the opening of the lower cover;
    a locking portion that is formed on an upper side wall of the upper cover and is locked by the locked portion to restrict the upper cover from moving in a detachment direction with respect to the lower cover;
    a contact rib that is formed on the upper side wall, protrudes toward the lower side wall, and has a distal end formed to be close to a side of an assembly direction in which the upper cover is assembled with respect to the lower cover compared to the locked portion; and
    a locking portion slit that passes through the upper side wall and is formed between the locking portion and the contact rib on the upper side wall, wherein
    the contact rib is formed on an inner circumferential surface of the upper side wall, and
    a contact rib slit formed on an opposite side of the locking portion slit with the contact rib interposed therebetween.

2. The electrical connection box according to claim 1, wherein
    the upper cover includes a ceiling and an opening opposite to the ceiling,
    the locking portion slit extends along the upper side wall from the opening of the upper cover to a location that is spaced away from the ceiling.

3. The electrical connection box according to claim 1, wherein
    the contact rib engages the lower side wall and the lower cover deforms the contact rib.

4. The electrical connection box according to claim 1, wherein
    each of the contact rib and the locking portion are deformable relative to the upper side wall, and
    the contact rib is deformable independently of the locking portion.

5. The electrical connection box according to claim 1, wherein
    the upper cover and the lower cover form an internal space,
    the contact rib protrudes from the upper side wall in a direction toward the internal space,
    the contact rib engages the lower side wall, and
    the lower cover deforms the contact rib away from the internal space.

6. The electrical connection box according to claim 1, wherein
    the lower cover has a center, and
    the contact rib presses the upper cover toward the center of the lower cover.

7. The electrical connection box according to claim 1, wherein the contact rib slit passes through the upper side wall.

8. The electrical connection box according to claim 7, wherein
    the upper side wall includes a contact rib wall piece that extends between the locking portion slit and the contact rib slit,
    the contact rib protrudes from and extends along the contact rib wall piece,
    the contact rib is spaced away from each of the contact rib slit and the locking portion slit.

* * * * *